US012813339B2

(12) United States Patent
Yim et al.

(10) Patent No.: US 12,813,339 B2
(45) Date of Patent: Nov. 24, 2026

(54) SEMICONDUCTOR PACKAGE

(71) Applicant: Samsung Electronics Co., Ltd., Suwon-si (KR)

(72) Inventors: Choong Bin Yim, Suwon-si (KR); Ji-Yong Park, Suwon-si (KR); Jin-Woo Park, Suwon-si (KR); Jong Bo Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 496 days.

(21) Appl. No.: 18/309,250

(22) Filed: Apr. 28, 2023

(65) Prior Publication Data

US 2024/0055398 A1 Feb. 15, 2024

(30) Foreign Application Priority Data

Aug. 11, 2022 (KR) ........................ 10-2022-0100440

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 74/111* (2026.01);
(Continued)

(58) Field of Classification Search
CPC ............. H01L 25/0655; H01L 23/3107; H01L 23/49816; H01L 24/16; H01L 24/32; H01L 24/33; H01L 24/48; H01L 24/73; H10B 80/00; H10W 90/00; H10W 74/111; H10W 90/701; H10W 72/07353; H10W 72/337;
(Continued)

(56) References Cited

U.S. PATENT DOCUMENTS

| | | | |
|---|---|---|---|
| 8,487,420 | B1 | 7/2013 | Hwang et al. |
| 8,816,487 | B2 | 8/2014 | Bae et al. |

(Continued)

FOREIGN PATENT DOCUMENTS

| | | | |
|---|---|---|---|
| JP | 2008-522402 | A | 6/2008 |
| KR | 20090090717 | A | 8/2009 |
| KR | 10-2017-0020663 | A | 2/2017 |
| KR | 10-2018-0051611 | A | 5/2018 |
| KR | 10-2019-0056156 | A | 5/2019 |
| KR | 10-2019-0129665 | A | 11/2019 |
| KR | 102137555 | B1 | 8/2020 |

*Primary Examiner* — Jay C Kim
*Assistant Examiner* — Woo K Lee
(74) *Attorney, Agent, or Firm* — Wolf, Greenfield & Sacks, P.C.

(57) ABSTRACT

A semiconductor package includes a first substrate, a memory semiconductor package on a first surface of the first substrate, an adhesive layer between the first surface of the first substrate and the memory semiconductor package, a wire extending from an upper surface of the memory semiconductor package and connected to the first substrate, a logic semiconductor chip on the first surface of the first substrate, a first connection terminal between the first surface of the first substrate and the logic semiconductor chip, and a molding layer, wherein a first height of the memory semiconductor package is smaller than a second height of the logic semiconductor chip, and wherein an uppermost surface of the molding layer and the upper surface of the logic semiconductor chip are coplanar.

20 Claims, 9 Drawing Sheets

(51) Int. Cl.

| | |
|---|---|
| ***H10W 72/00*** | (2026.01) |
| ***H10W 72/30*** | (2026.01) |
| ***H10W 74/10*** | (2026.01) |
| ***H10W 74/15*** | (2026.01) |

(52) U.S. Cl.
CPC .... *H10W 90/701* (2026.01); *H10W 72/07353* (2026.01); *H10W 72/337* (2026.01); *H10W 72/865* (2026.01); *H10W 72/884* (2026.01); *H10W 74/15* (2026.01); *H10W 90/724* (2026.01); *H10W 90/733* (2026.01); *H10W 90/734* (2026.01); *H10W 90/736* (2026.01); *H10W 90/754* (2026.01)

(58) Field of Classification Search
CPC ............. H10W 72/865; H10W 72/884; H10W 74/15; H10W 90/724; H10W 90/733; H10W 90/734; H10W 90/736; H10W 90/754
See application file for complete search history.

(56) References Cited

U.S. PATENT DOCUMENTS

| | | | | |
|---|---|---|---|---|
| 9,136,159 | B2 | 9/2015 | Kelly et al. | |
| 9,653,428 | B1 | 5/2017 | Hiner et al. | |
| 10,032,748 | B2 | 7/2018 | Hiner et al. | |
| 10,056,267 | B2 | 8/2018 | Cheng et al. | |
| 10,312,220 | B2 | 6/2019 | Hiner et al. | |
| 10,497,674 | B2 | 12/2019 | Hiner et al. | |
| 10,510,694 | B2 | 12/2019 | Benson et al. | |
| 11,088,082 | B2 | 8/2021 | Kim et al. | |
| 2007/0216010 | A1* | 9/2007 | Yim | H01L 25/03 257/E23.07 |
| 2012/0326304 | A1 | 12/2012 | Warren et al. | |
| 2021/0082872 | A1* | 3/2021 | Yu | H01L 23/5386 |
| 2023/0178442 | A1* | 6/2023 | Dou | H01L 23/58 438/15 |

* cited by examiner

SEMICONDUCTOR PACKAGE

CROSS-REFERENCE TO RELATED APPLICATION

This application claims priority from Korean Patent Application No. 10-2022-0100440 filed on Aug. 11, 2022 in the Korean Intellectual Property Office and all the benefits accruing therefrom under 35 U.S.C. 119, the contents of which are herein incorporated by reference in their entirety.

BACKGROUND

The present disclosure relates to a semiconductor package.

Recently, as implementation of high performance devices is required, a size of a semiconductor chip is increased and a size of a semiconductor package is correspondingly increased. On the other hand, a thickness of the semiconductor package is reduced in accordance with the slimness tendency of the electronic device.

The semiconductor package has been developed to satisfy multi-function, high capacity and miniaturization requirements. To this end, several semiconductor chips have been integrated into one semiconductor package so that the size of the semiconductor package has been remarkably reduced and high capacity and multi-functionality have been achieved.

SUMMARY

An object of the present disclosure is to provide a semiconductor package in which two semiconductor chips having different thicknesses are disposed on one substrate, a semiconductor chip having a relatively small thickness is connected to the substrate by a wire, and a semiconductor chip having a relatively large thickness is connected to the substrate by a connection terminal, so that warpage of the substrate or the semiconductor chip having a relatively small thickness may be prevented from occurring in a process of packaging the semiconductor chip having a relatively small thickness on the substrate.

Another object of the present disclosure is to provide a semiconductor package in which two semiconductor chips having different thicknesses are disposed on one substrate, and a heat sink or a heat transfer layer, which has high heat transfer performance, is disposed on an upper surface of a semiconductor chip having a relatively greater thickness, so that heat dissipation performance is improved.

According to some embodiments of the present disclosure, there is provided a semiconductor package, including a first substrate including a first surface and a second surface opposite the first surface, a memory semiconductor package on the first surface of the first substrate, the memory semiconductor package including a plurality of memory semiconductor chips, an adhesive layer between the first surface of the first substrate and the memory semiconductor package, the adhesive layer attaching the memory semiconductor package to the first surface of the first substrate, a wire extending from an upper surface of the memory semiconductor package to the first substrate, the wire electrically connecting the first substrate and the memory semiconductor package, a logic semiconductor chip spaced apart from the memory semiconductor package in a first horizontal direction on the first surface of the first substrate, a first connection terminal between the first surface of the first substrate and the logic semiconductor chip, the first connection terminal electrically connecting the first substrate and the logic semiconductor chip, and a molding layer covering the wire, sidewalls and at least a portion of the upper surface of the memory semiconductor package and at least a portion of sidewalls of the logic semiconductor chip on the first surface of the first substrate, wherein a first height from the first surface of the first substrate to the upper surface of the memory semiconductor package in a vertical direction is smaller than a second height from the first surface of the first substrate to an upper surface of the logic semiconductor chip in the vertical direction, and wherein an uppermost surface of the molding layer and the upper surface of the logic semiconductor chip are coplanar.

According to some embodiments of the present disclosure, there is provided a semiconductor package, including a first substrate including a first surface and an opposite second surface, a first semiconductor chip on the first surface of the first substrate, an adhesive layer between the first surface of the first substrate and the first semiconductor chip, the adhesive layer attaching the first semiconductor chip to the first surface of the first substrate, a wire extending from an upper surface of the first semiconductor chip to the first substrate, the wire electrically connecting the first substrate and the first semiconductor chip, a second semiconductor chip on the first surface of the first substrate, the second semiconductor chip spaced apart from the first semiconductor chip, a first connection terminal between the first surface of the first substrate and the second semiconductor chip, the first connection terminal electrically connecting the first substrate and the second semiconductor chip, a molding layer on the first surface of the first substrate, the molding layer covering the wire, sidewalls and at least a portion of the upper surface of the first semiconductor chip and at least a portion of sidewalls of the second semiconductor chip, and a heat transfer layer on an upper surface of the molding layer and an upper surface of the second semiconductor chip, the heat transfer layer in contact with the upper surface of the second semiconductor chip, wherein a first height from the first surface of the first substrate to the upper surface of the first semiconductor chip is smaller than a second height from the first surface of the first substrate to the upper surface of the second semiconductor chip.

According to some embodiments of the present disclosure, there is provided a semiconductor package, including a first substrate including a first surface and a second surface opposite the first surface, a memory semiconductor package on the first surface of the first substrate, an adhesive layer between the first surface of the first substrate and the memory semiconductor package, the adhesive layer attaching the memory semiconductor package to the first surface of the first substrate, a wire extending between an upper surface of the memory semiconductor package and the first substrate, the wire electrically connecting the first substrate and the memory semiconductor package, a logic semiconductor chip on the first surface of the first substrate and spaced apart from the memory semiconductor package, a first connection terminal between the first surface of the first substrate and the logic semiconductor chip, the first connection terminal electrically connects the first substrate with the logic semiconductor chip, a molding layer on the first surface of the first substrate, the molding layer on the wire, sidewalls and at least a portion of the upper surface of the memory semiconductor package and at least a portion of sidewalls of the logic semiconductor chip, and a heat sink on an upper surface of the molding layer and an upper surface of the logic semiconductor chip, the heat sink in contact with the upper surface of the logic semiconductor chip, wherein a first height from the first surface of the first substrate to the upper surface of the memory semiconductor package is smaller than a second height from the first surface of the first substrate to the upper surface of the logic semiconductor chip, and wherein the upper surface of the molding layer is coplanar with the upper surface of the logic semiconductor chip.

The objects of the present disclosure are not limited to those mentioned above and additional objects of the present disclosure, which are not mentioned herein, will be clearly understood by those skilled in the art from the following description of the present disclosure.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Hereinafter, a semiconductor package according to some embodiments of the present disclosure will be described with reference to FIGS. 1 and 2.

Figure 1:
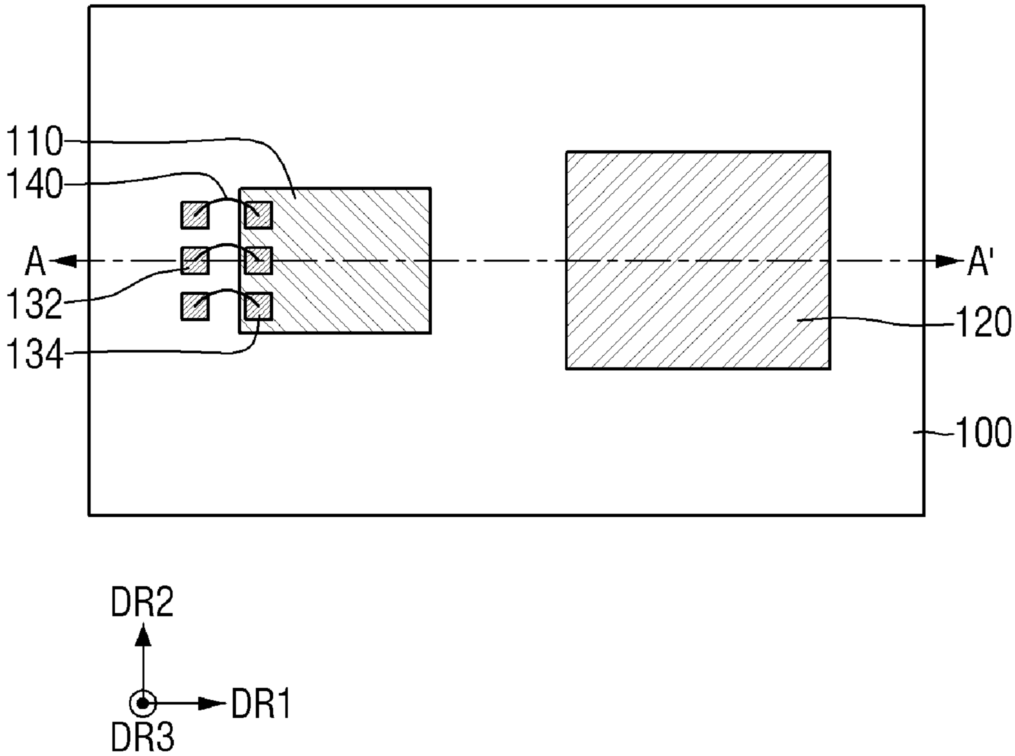
FIG. 1 is a plan view illustrating a semiconductor package according to some embodiments of the present disclosure.

FIG. 1 is a plan view illustrating a semiconductor package according to some embodiments of the present disclosure. FIG. 2 is a cross-sectional view taken along line A-A' of FIG. 1.

Figure 2:
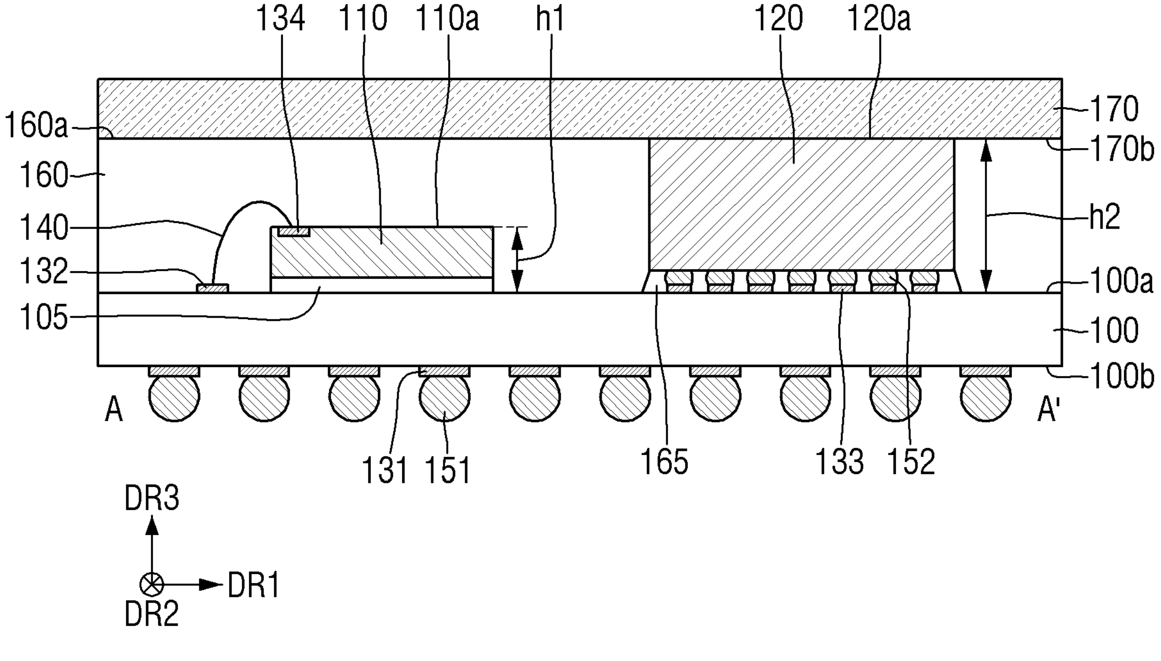
FIG. 2 is a cross-sectional view taken along line A-A' of FIG. 1.

Referring to FIGS. 1 and 2, the semiconductor package according to some embodiments of the present disclosure includes a first substrate 100, an adhesive layer 105, a first semiconductor chip 110, a second semiconductor chip 120, first to fourth conductive pads 131, 132, 133 and 134, a wire 140, first and second connection terminals 151 and 152, a molding layer 160, an underfill material 165, and a heat sink 170.

The first substrate 100 may be, for example, a printed circuit board (PCB) or a ceramic substrate, but the present disclosure is not limited thereto. When the first substrate 100 is a printed circuit board, the first substrate 100 may be made of at least one material selected from a phenol resin, an epoxy resin or a polyimide. For example, the first substrate 100 may include at least one material selected from FR4, tetrafunctional epoxy, polyphenylene ether, epoxy/polyphenylene oxide, bismaleimide triazine (BT), thermount, cyanate ester, polyimide or liquid crystal polymer. In some other embodiments, the first substrate 100 may be an interposer.

The first substrate 100 may include a first surface **100*a* and a second surface 100*b* opposed to the first surface 100*a*. For example, in FIG. 2, the first surface 100*a* of the first substrate 100 may be defined as an upper surface of the first substrate 100, and the second surface 100*b* of the first substrate 100 may be defined as a lower surface of the first substrate 100**.

Hereinafter, each of a first horizontal direction DR1 and a second horizontal direction DR2 may be defined in a direction parallel with the upper surface **100*a* of the first substrate 100. The second horizontal direction DR2 may be defined as a direction different from (e.g., perpendicular to) the first horizontal direction DR1. A vertical direction DR3 may be defined as a direction perpendicular to each of the first horizontal direction DR1 and the second horizontal direction DR2**.

The first conductive pad 131 may be disposed on the second surface **100*b* of the first substrate 100. For example, the first conductive pad 131 may protrude from the second surface 100*b* of the first substrate 100, but the present disclosure is not limited thereto. In some other embodiments, the first conductive pad 131 may be buried in the first substrate 100. In this case, at least a portion of the first conductive pad 131 buried in the first substrate 100 may be exposed. The first conductive pad 131** may include a conductive material.

The first connection terminal 151 may be disposed on the second surface **100*b* of the first substrate 100. The first connection terminal 151 may be connected to the first conductive pad 131. The first connection terminal 151 may protrude to be convex from the second surface 100*b* of the first substrate 100. The first connection terminal 151 may be a portion in which the first substrate 100** is electrically connected to another external device.

The first connection terminal 151 may include at least one of, for example, tin (Sn), indium (In), lead (Pb), zinc (Zn), nickel (Ni), gold (Au), silver (Ag), copper (Cu), antimony (Sb), bismuth (Bi), or combinations thereof, the present disclosure is not limited thereto.

The second conductive pad 132 may be disposed on the first surface **100*a* of the first substrate 100. For example, the second conductive pad 132 may protrude from the first surface 100*a* of the first substrate 100, but the present disclosure is not limited thereto. In some other embodiments, the second conductive pad 132 may be buried in the first substrate 100. In this case, at least a portion of the second conductive pad 132 buried in the first substrate 100 may be exposed. The second conductive pad 132** may include a conductive material.

For example, the second conductive pad 132 may include a plurality of conductive pads spaced apart from each other in the second horizontal direction DR2. Although FIG. 1 shows that the second conductive pad 132 is disposed only on one side of the first semiconductor chip 110 in the first horizontal direction DR1, the present disclosure is not limited thereto. In some other embodiments, the second conductive pad 132 may be disposed on both sides of the first semiconductor chip 110 in the first horizontal direction DR1.

The third conductive pad 133 may be disposed on the first surface 100*a* of the first substrate 100. For example, the third conductive pad 133 may be spaced apart from the second conductive pad 132 in the first horizontal direction DR1. For example, the third conductive pad 133 may protrude from the first surface 100*a* of the first substrate 100, but the present disclosure is not limited thereto. In some other embodiments, the third conductive pad 133 may be buried in the first substrate 100. In this case, at least a portion of the third conductive pad 133 buried in the first substrate 100 may be exposed. The third conductive pad 133 may include a conductive material.

The adhesive layer 105 may be disposed on the first surface 100*a* of the first substrate 100. For example, the adhesive layer 105 may be disposed between the second conductive pad 132 and the third conductive pad 133. The adhesive layer 105 may be spaced apart from each of the second conductive pad 132 and the third conductive pad 133 in the first horizontal direction DR1. The adhesive layer 105 may include at least one organic resin of, for example, an epoxy resin, an acrylic resin, a polyester resin or polycarbonate, but the present disclosure is not limited thereto.

The first semiconductor chip 110 may be disposed on the adhesive layer 105 on the first surface 100*a* of the first substrate 100. The first semiconductor chip 110 may be attached onto the first surface 100*a* of the first substrate 100 by using the adhesive layer 105. That is, the first semiconductor chip 110 may overlap or align with the adhesive layer 105 in the vertical direction DR3. For example, the first semiconductor chip 110 may be spaced apart from the second conductive pad 132 in the first horizontal direction DR1.

Although FIG. 2 shows that a width of the first semiconductor chip 110 in the first horizontal direction DR1 is equal to that of the adhesive layer 105 in the first horizontal direction DR1, the present disclosure is not limited thereto. In some other embodiments, the width of the first semiconductor chip 110 in the first horizontal direction DR1 may be different from that of the adhesive layer 105 in the first horizontal direction DR1.

For example, the first semiconductor chip 110 may be a memory semiconductor package that includes a plurality of memory semiconductor chips stacked in the vertical direction DR3. For example, the first semiconductor chip 110 may be a high bandwidth memory (HBM) formed as a plurality of memory semiconductor chips are formed. For example, when the first semiconductor chip 110 is a memory semiconductor package, the memory semiconductor chip included in the first semiconductor chip 110 may be a volatile memory such as a dynamic random access memory (DRAM) or a static random access memory (SRAM), or may be a non-volatile memory such as a flash memory, a phase change random access memory (PRAM), a magnetoresistive random access memory (MRAM), a ferroelectric random access memory (FeRAM) or a resistive random access memory (RRAM).

The fourth conductive pad 134 may be disposed on an upper surface 110*a* of the first semiconductor chip 110. Although FIG. 2 shows that an upper surface of the fourth conductive pad 134 is formed on the same plane as the upper surface 110*a* of the first semiconductor chip 110, the present disclosure is not limited thereto. In some other embodiments, the fourth conductive pad 134 may protrude from the upper surface 110*a* of the first semiconductor chip 110. The fourth conductive pad 134 may include a conductive material.

The wire 140 may connect the second conductive pad 132 with the fourth conductive pad 134. The wire 140 may have a line shape or curved line shape. The wire 140 may extend from the upper surface 110*a* of the first semiconductor chip 110 and then connect to the first substrate 100. For example, one end of the wire 140 (e.g. a first end of the wire 140) may be connected to the second conductive pad 132, and the other end of the wire 140 (e.g., a second opposite end of the wire 140) may be connected to the fourth conductive pad 134. The first semiconductor chip 110 and the first substrate 100 may be electrically connected to each other through the wire 140. That is, the first semiconductor chip 110 and the first substrate 100 may be electrically connected to each other through wire bonding. The wire 140 may include a conductive material.

The second connection terminal 152 may be disposed on the first surface 100*a* of the first substrate 100. The second connection terminal 152 may be connected to the third conductive pad 133. The second connection terminal 152 may be disposed between the third conductive pad 133 and the second semiconductor chip 120. The second connection terminal 152 may be in contact with each of the third conductive pad 133 and the second semiconductor chip 120.

The second connection terminal 152 may include at least one of, for example, tin (Sn), indium (In), lead (Pb), zinc (Zn), nickel (Ni), gold (Au), silver (Ag), copper (Cu), antimony (Sb), bismuth (Bi), or combinations thereof, but the present disclosure is not limited thereto.

The second semiconductor chip 120 may be disposed on the third conductive pad 133 on the first surface 100*a* of the first substrate 100. That is, the second semiconductor chip 120 may overlap or align with the third conductive pad 133 in the vertical direction DR3. The second semiconductor chip 120 may be spaced apart from the first semiconductor chip 110 in the first horizontal direction DR1. The second semiconductor chip 120 may be electrically connected to the first substrate 100 through the second connection terminal 152 and the third conductive pad 133.

The second semiconductor chip 120 may be, for example, a logic semiconductor chip. For example, the second semiconductor chip 120 may be a central processing unit (CPU), a graphic processing unit (GPU), a field-programmable gate array (FPGA), a digital signal processor, an encryption processor, a microprocessor, a microcontroller, or an application processor (AP).

An upper surface 120*a* of the second semiconductor chip 120 may be at a higher vertical level than the upper surface 110*a* of the first semiconductor chip 110. For example, a first height h1 from the first surface 100*a* of the first substrate 100 to the upper surface 110*a* of the first semiconductor chip 110 in the vertical direction DR3 may be smaller than a second height h2 from the first surface 100*a* of the first substrate 100 to the upper surface 120*a* of the second semiconductor chip 120 in the vertical direction DR3. For example, a thickness of the first semiconductor chip 110 in the vertical direction DR3 may be smaller than that of the second semiconductor chip 120 in the vertical direction DR3.

The underfill material 165 may be disposed between the first surface 100*a* of the first substrate 100 and a lower surface of the second semiconductor chip 120. The underfill material 165 may surround sidewalls of the third conductive pad 133 and sidewalls of the second connection terminal 152. For example, the underfill material 165 may extend further in a lateral direction than sidewalls of the second semiconductor chip 120, but the present disclosure is not limited thereto. The underfill material 165 may include, for example, an insulating polymer material such as an epoxy molding compound (EMC), but the present disclosure is not limited thereto.

The molding layer 160 may be disposed on the first surface 100*a* of the first substrate 100. The molding layer 160 may cover the wire 140, sidewalls of the adhesive layer 105, sidewalls and an upper surface of the first semiconductor chip 110, sidewalls of the underfill material 165 and sidewalls of the second semiconductor chip 120. However, the molding layer 160 may not be disposed on the upper surface 120*a* of the second semiconductor chip 120. For example, the molding layer 160 may completely cover the upper surface 110*a* of the first semiconductor chip 110.

For example, an upper surface 160*a* of the molding layer 160 may be formed on the same plane as or be coplanar with the upper surface 120*a* of the second semiconductor chip 120. For example, the upper surface 160*a* of the molding layer 160 may be entirely formed on the same plane as the upper surface 120*a* of the second semiconductor chip 120, but the present disclosure is not limited thereto. In some other embodiments, at least a portion of the upper surface 160*a* of the molding layer 160 may be formed to be at a lower vertical level than the upper surface 120*a* of the second semiconductor chip 120.

For example, sidewalls of the molding layer 160 may be aligned in the vertical direction DR3 with those of the first substrate 100 (e.g., sidewalls of the first substrate 100 and the molding layer 160 may be coplanar), but the present disclosure is not limited thereto. The molding layer 160 may include, for example, an epoxy molding compound (EMC) or two or more silicon hybrid materials, but the present disclosure is not limited thereto.

The heat sink 170 may be disposed on the upper surface 160*a* of the molding layer 160 and the upper surface 120*a* of the second semiconductor chip 120. A lower surface 170*b* of the heat sink 170 may be in contact with each of the upper surface 160*a* of the molding layer 160 and the upper surface 120*a* of the second semiconductor chip 120. Although FIG. 2 shows that the heat sink 170 is disposed only on the upper surface 160*a* of the molding layer 160 and the upper surface 120*a* of the second semiconductor chip 120, the present disclosure is not limited thereto. In some other embodiments, the heat sink 170 may cover the sidewalls of the molding layer 160.

For example, the heat sink 170 may emit heat generated from the second semiconductor chip 120 to the outside of the semiconductor package. The heat sink 170 may include a material having high thermal conductivity. The heat sink 170 may include at least one of, for example, copper (Cu), nickel (Ni) or gold (Au), but the present disclosure is not limited thereto.

In the semiconductor package according to some embodiments of the present disclosure, the first semiconductor chip 110 and the second semiconductor chip 120, which have their respective thicknesses different from each other in the vertical direction DR3, may be disposed to be spaced apart from each other in the horizontal direction DR1 on one substrate 100, and the first semiconductor chip 110 having a relatively small thickness may be electrically connected to the substrate 100 by using the wire 140 and the second semiconductor chip 120 having a relatively great thickness may be electrically connected to the substrate 100 by using the connection terminal 152. The first semiconductor chip 110 may be packaged on the substrate 100 by using the adhesive layer 105, so that warpage of the substrate 100 or the first semiconductor chip 110 may be prevented from occurring in the process of packaging the first semiconductor chip 110 on the substrate 100. As a result, the semiconductor package according to some embodiments of the present disclosure may improve reliability of a connection relation between two semiconductor chips 110 and 120 having different thicknesses and one substrate 100.

In addition, in the semiconductor package according to some embodiments of the present disclosure, the heat sink 170 having high heat transfer performance may be disposed to be in contact with the upper surface 120*a* of the second semiconductor chip 120 having a relatively great thickness in the vertical direction DR3, whereby heat dissipation performance of the semiconductor package may be improved.

Hereinafter, a method of manufacturing a semiconductor package according to some embodiments of the present disclosure will be described with reference to FIGS. 3 to 8.

FIGS. 3 to 8 are views illustrating intermediate steps to describe a method of manufacturing a semiconductor package according to some embodiments of the present disclosure.

Figure 3:
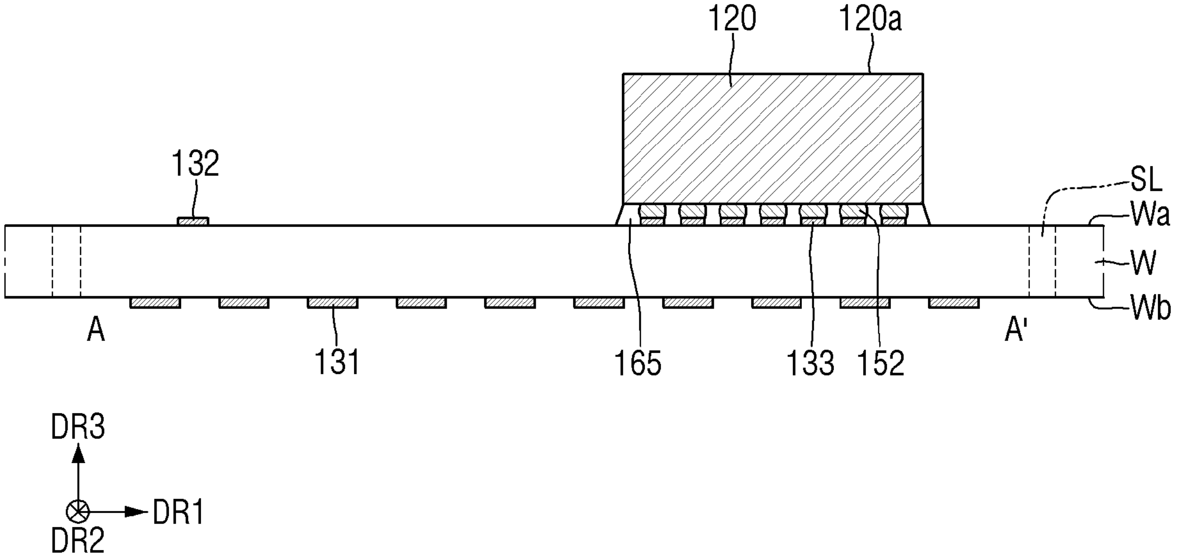
FIGS. 3 to 8 are views illustrating intermediate steps to describe a method of manufacturing a semiconductor package according to some embodiments of the present disclosure.

Referring to FIG. 3, a wafer W, which includes a first surface Wa that is an upper surface and a second surface Wb that is a lower surface, may be provided. Subsequently, a first conductive pad 131 may be formed on the second surface Wb of the wafer W. In addition, a second conductive pad 132 and a third conductive pad 133 may be formed on the first surface Wa of the wafer W. The third conductive pad 133 may be spaced apart from the second conductive pad 132 in the first horizontal direction DR1.

Subsequently, a second semiconductor chip 120 may be packaged on the first surface Wa of the wafer W. The second semiconductor chip 120 may be attached to the third conductive pad 133 by using a second connection terminal 152 formed on a lower surface of the second semiconductor chip 120. Subsequently, an underfill material 165 may be formed between the first surface Wa of the wafer W and the lower surface of the second semiconductor chip 120 to surround sidewalls of the third conductive pad 133 and sidewalls of the second connection terminal 152.

Figure 4:
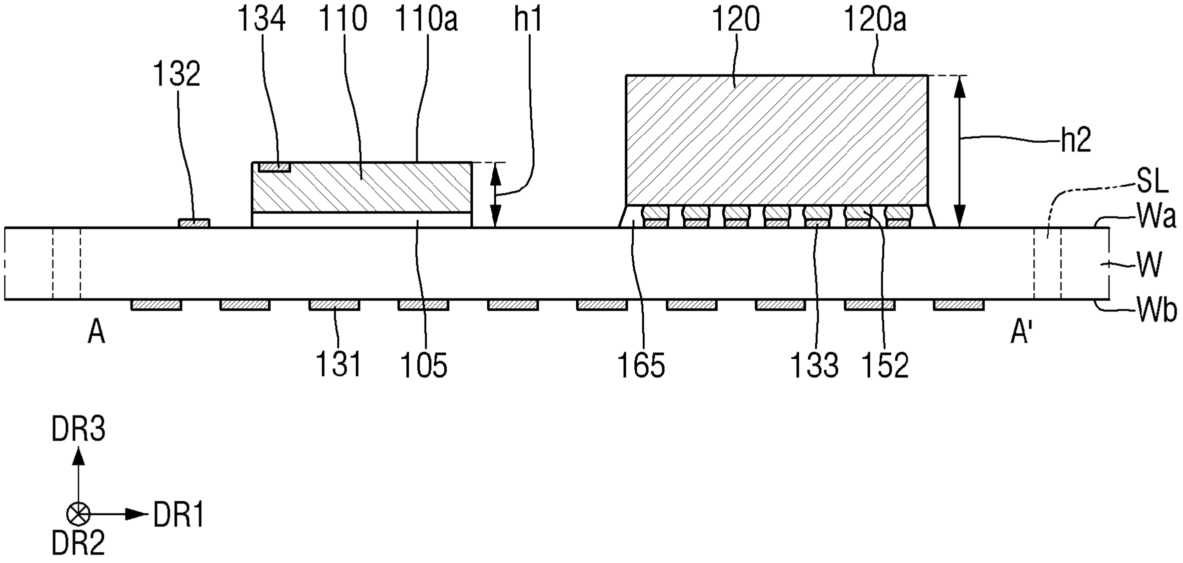

Referring to FIG. 4, an adhesive layer 105 may be formed on the first surface Wa of the wafer W. For example, the adhesive layer 105 may be spaced apart from the second conductive pad 132 in the first horizontal direction DR1. For example, the adhesive layer 105 may be formed between the second conductive pad 132 and the second semiconductor chip 120. The second semiconductor chip 120 may be spaced apart from the adhesive layer 105 in the first horizontal direction DR1.

Subsequently, the first semiconductor chip 110 may be packaged on the first surface Wa of the wafer W. The first semiconductor chip 110 may be attached onto the first surface Wa of the wafer W by using the adhesive layer 105. The second semiconductor chip 120 may be spaced apart from the first semiconductor chip 110 in the first horizontal direction DR1.

An upper surface 120*a* of the second semiconductor chip 120 may be at a higher vertical level than an upper surface 110*a* of the first semiconductor chip 110. For example, a first height h1 from the first surface Wa of the wafer W to the upper surface 110*a* of the first semiconductor chip 110 in the vertical direction DR3 may be smaller than a second height h2 from the first surface Wa of the wafer W to the upper surface 120*a* of the second semiconductor chip 120 in the vertical direction DR3. For example, a thickness of the first semiconductor chip 110 in the vertical direction DR3 may be smaller than that of the second semiconductor chip 120 in the vertical direction DR3.

Figure 5:
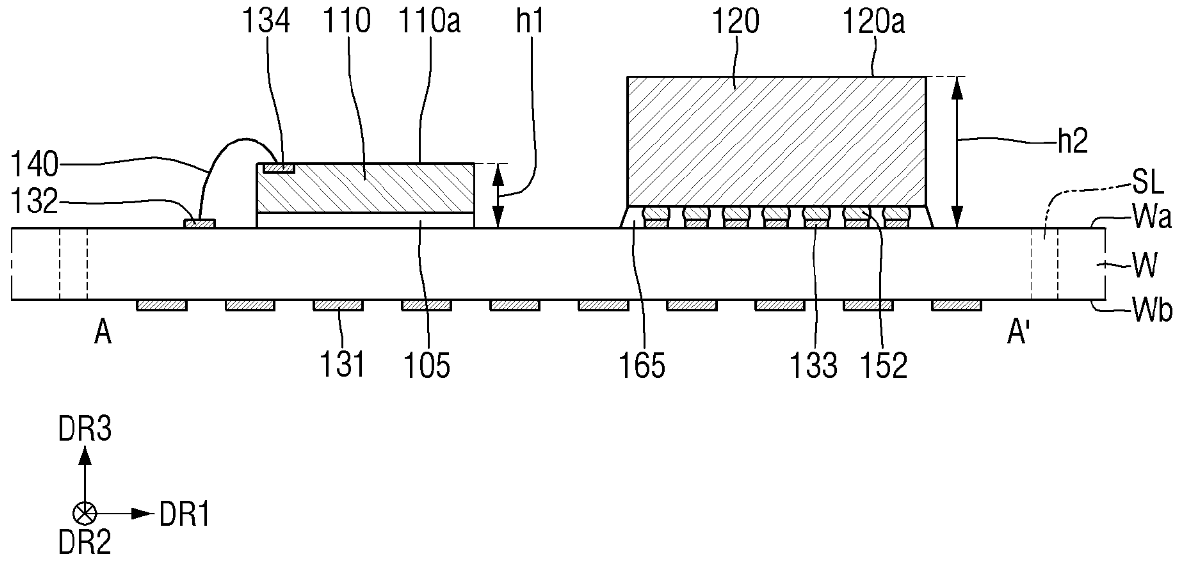

Referring to FIG. 5, the wafer W and the first semiconductor chip 110 may be electrically connected to each other using the wire 140. For example, the second conductive pad 132 formed on the first surface Wa of the wafer W and a fourth conductive pad 134 formed on the upper surface 110*a* of the first semiconductor chip 110 may be connected to the wire 140. One end of the wire 140 may be connected to the second conductive pad 132, and the other end of the wire 140 may be connected to the fourth conductive pad 134.

Figure 6:
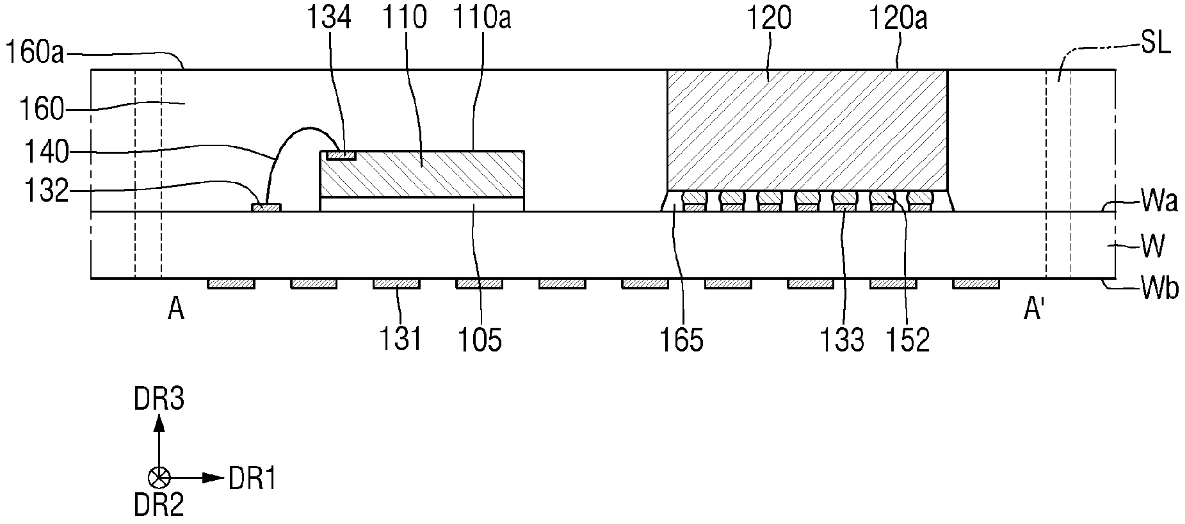

Referring to FIG. 6, a molding layer 160 may be formed on the first surface Wa of the wafer W. The molding layer 160 may cover the wire 140, sidewalls of the adhesive layer 105, sidewalls and an upper surface of the first semiconductor chip 110, sidewalls of the underfill material 165 and sidewalls of the second semiconductor chip 120. The upper surface 120*a* of the second semiconductor chip 120 may be exposed at an upper surface 160*a* of the molding layer 160. The upper surface 110*a* of the first semiconductor chip 110 may be completely covered by the molding layer 160. For example, the upper surface 160*a* of the molding layer 160 may be formed on the same plane as the upper surface 120*a* of the second semiconductor chip 120, but the present disclosure is not limited thereto.

Figure 7:
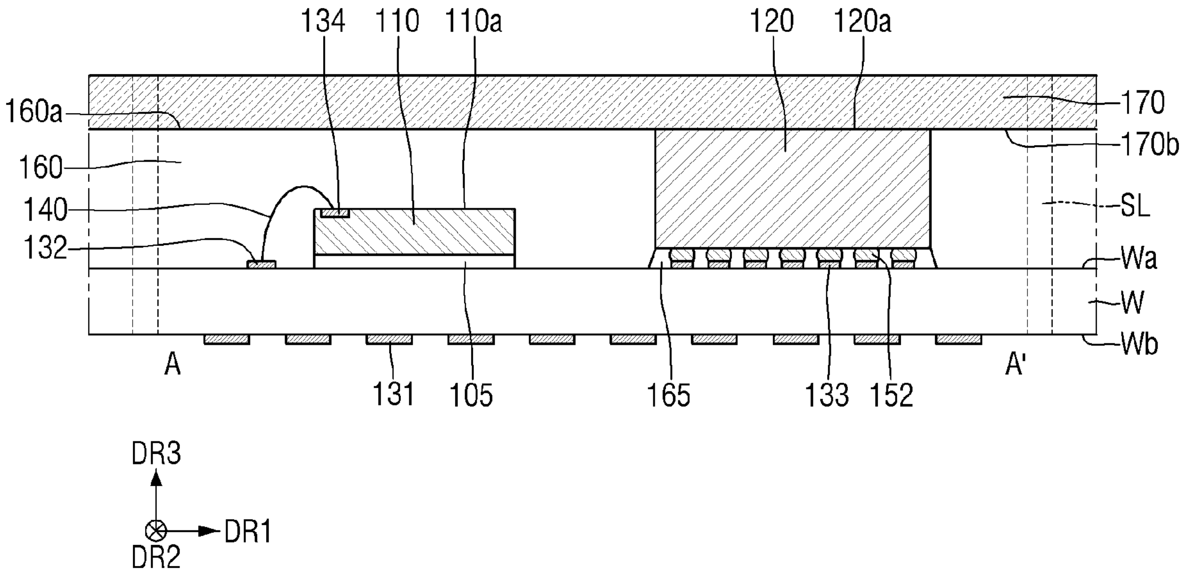

Referring to FIG. 7, a heat sink 170 may be formed on the upper surface 160*a* of the molding layer 160 and the upper surface 120*a* of the second semiconductor chip 120. The heat sink 170 may be in contact with the upper surface 120*a* of the second semiconductor chip 120.

Figure 8:
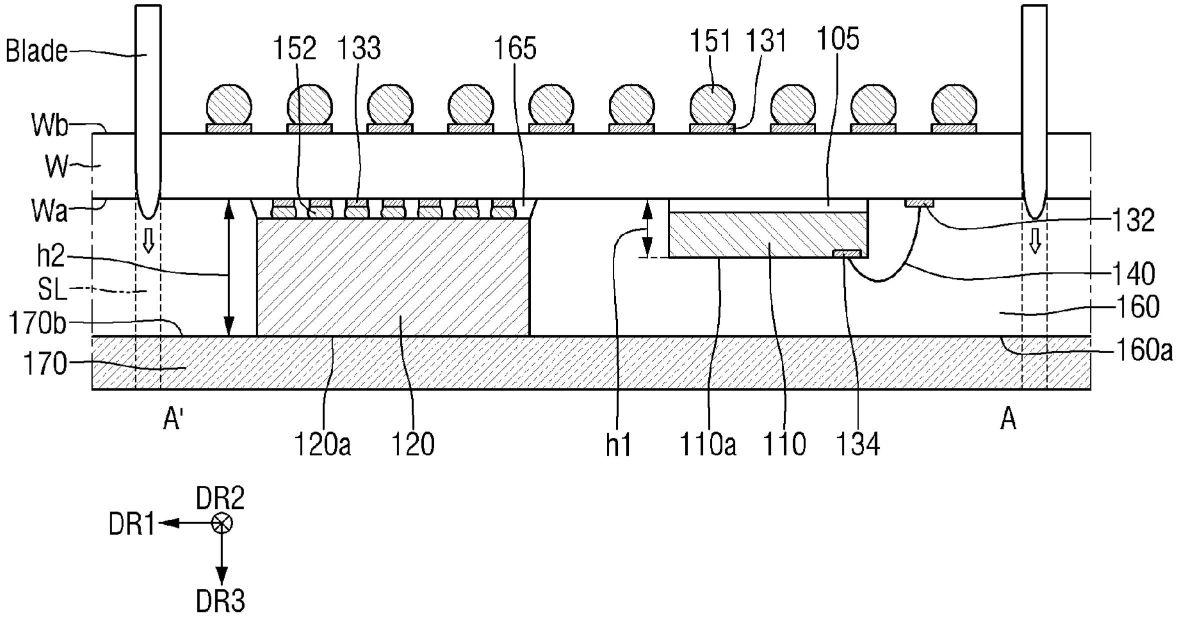

Referring to FIG. 8, after a manufacturing process shown in FIG. 7 is performed, upper and lower portions may be inverted. Subsequently, a first connection terminal 151 may be formed on the first conductive pad 131. Subsequently, a sawing process may be performed along a scribe line SL. For example, the sawing process may be performed using a blade, but the present disclosure is not limited thereto. After the sawing process is performed, the cut wafer W may be defined as the first substrate (100 of FIG. 2). After such a manufacturing process is performed, the semiconductor package shown in FIG. 2 may be manufactured by inversion of the upper and lower portions.

Hereinafter, a semiconductor package according to some other embodiments of the present disclosure will be described with reference to FIG. 9. The following description will be based on differences from the semiconductor package shown in FIGS. 1 and 2.

Figure 9:
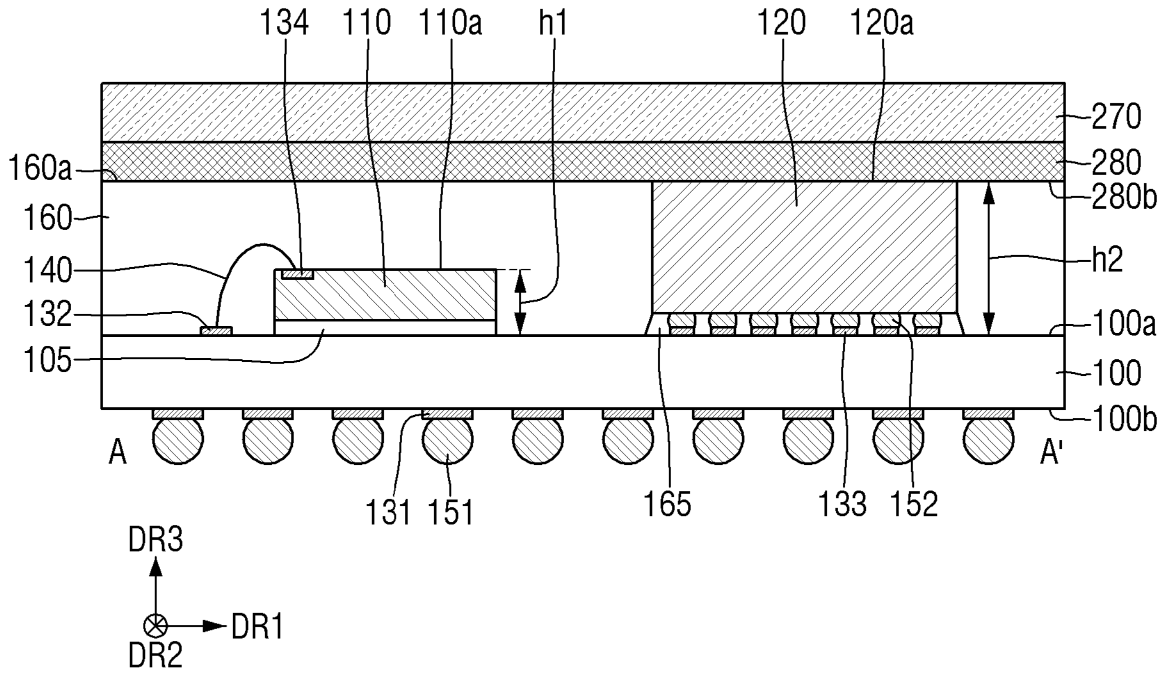
FIG. 9 is a cross-sectional view illustrating a semiconductor package according to some embodiments of the present disclosure.

FIG. 9 is a cross-sectional view illustrating a semiconductor package according to some other embodiments of the present disclosure.

Referring to FIG. 9, in the semiconductor package according to some other embodiments of the present disclosure, a heat transfer layer 280 may be disposed between the molding layer 160 and the second semiconductor chip 120 and the heat sink 270.

For example, the heat transfer layer 280 may be disposed on the upper surface 160*a* of the molding layer 160 and the upper surface 120*a* of the second semiconductor chip 120. A lower surface 280*b* of the heat transfer layer 280 may be in contact with each of the upper surface 160*a* of the molding layer 160 and the upper surface 120*a* of the second semiconductor chip 120. The heat transfer layer 280 may include a material having high heat transfer performance. For example, the heat transfer layer 280 may include a conductive material such as metal. In some other embodiments, the heat transfer layer 280 may include a non-conductive material having high heat transfer performance.

The heat sink 270 may be disposed on an upper surface of the heat transfer layer 280. The heat sink 270 may be in contact with the upper surface of the heat transfer layer 280. Although FIG. 9 shows that the heat sink 270 is disposed only on the upper surface of the heat transfer layer 280, the present disclosure is not limited thereto. In some other embodiments, the heat sink 270 may be also disposed on sidewalls of the molding layer 160.

Hereinafter, a semiconductor package according to some other embodiments of the present disclosure will be described with reference to FIG. 10. The following description will be based on differences from the semiconductor package shown in FIG. 9.

Figure 10:
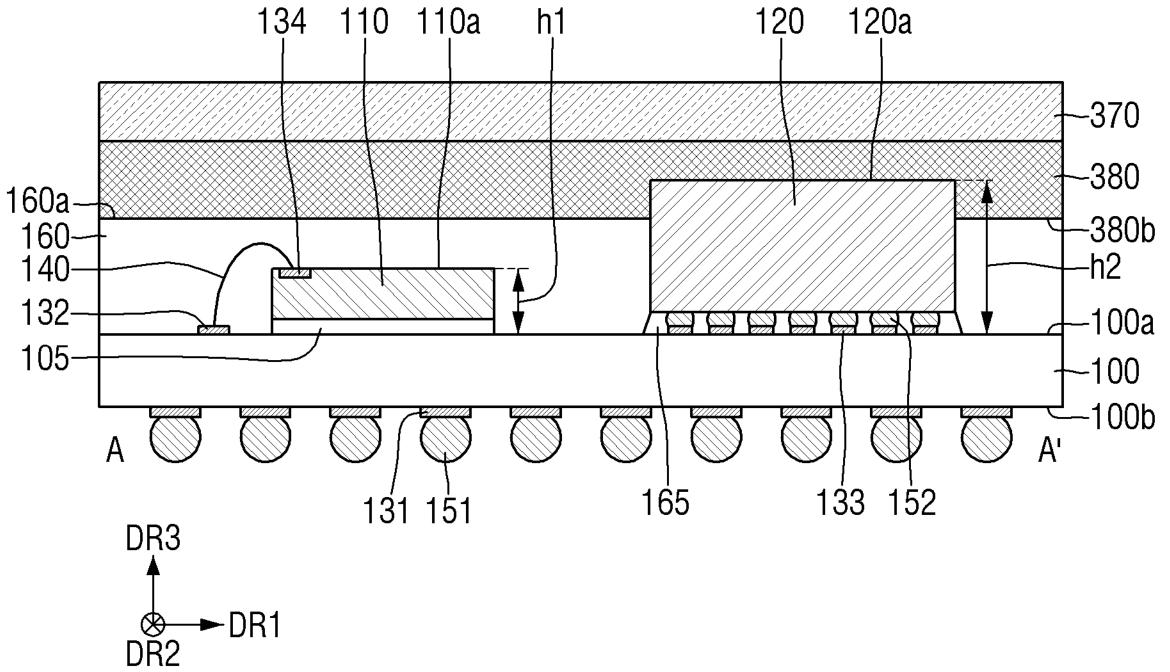
FIG. 10 is a cross-sectional view illustrating a semiconductor package according to some other embodiments of the present disclosure.

FIG. 10 is a cross-sectional view illustrating a semiconductor package according to some other embodiments of the present disclosure.

Referring to FIG. 10, in the semiconductor package according to some other embodiments of the present disclosure, the upper surface 160*a* of the molding layer 160 may be formed to be at a lower vertical level than the upper surface 120*a* of the second semiconductor chip 120.

For example, at least a portion of the second semiconductor chip 120 may be more protruded or at a higher level in the vertical direction DR3 than the upper surface 160*a* of the molding layer 160. For example, a heat transfer layer 380 may be disposed on the upper surface 160*a* of the molding layer 160 and the sidewalls and the upper surface 120*a* of the protruded second semiconductor chip 120. A lowermost surface 380*b* of the heat transfer layer 380 may be in contact with the upper surface 160*a* of the molding layer 160. The heat transfer layer 380 may be in contact with the upper surface 120*a* of the second semiconductor chip 120.

The heat transfer layer 380 may be in contact with at least a portion of the sidewalls of the second semiconductor chip 120. For example, the heat transfer layer 380 may be in contact with a portion of the sidewalls of the second semiconductor chip 120 more protruded or at a higher level in the vertical direction DR3 than the upper surface 160*a* of the molding layer 160. A heat sink 370 may be disposed on an upper surface of the heat transfer layer 380. The heat sink 370 may be in contact with the upper surface of the heat transfer layer 380.

Hereinafter, a semiconductor package according to some other embodiments of the present disclosure will be described with reference to FIG. 11. The following description will be based on differences from the semiconductor package shown in FIG. 9.

Figure 11:
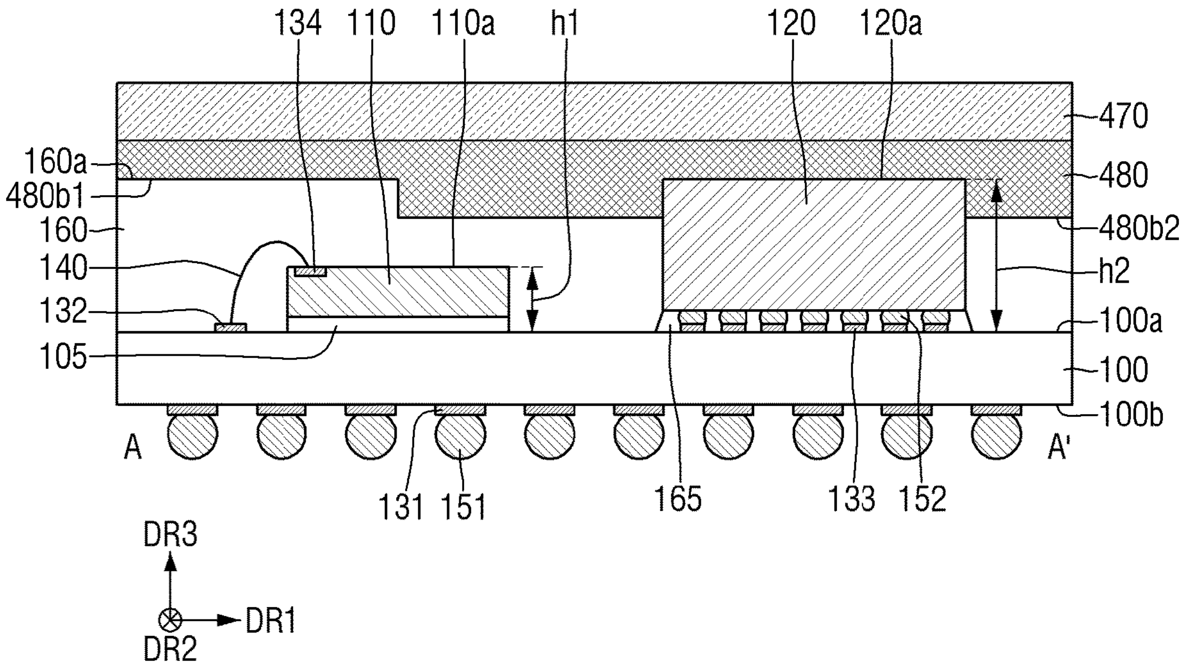
FIG. 11 is a cross-sectional view illustrating a semiconductor package according to some other embodiments of the present disclosure.

FIG. 11 is a cross-sectional view illustrating a semiconductor package according to some other embodiments of the present disclosure.

Referring to FIG. 11, in the semiconductor package according to some other embodiments of the present disclosure, at least a portion of the upper surface 160*a* of the molding layer 160 may be formed to be at a lower vertical level than the upper surface 120*a* of the second semiconductor chip 120.

For example, the upper surface 160*a* of the molding layer 160 may have a step difference or be stepped. A portion of the upper surface 160*a* of the molding layer 160, which covers or surrounds the wire 140, may be formed to be at a higher vertical level than a portion of the upper surface 160*a* of the molding layer 160, which is in contact with the sidewalls of the second semiconductor chip 120. At least a portion of the second semiconductor chip 120 may be more protruded or at a higher level in the vertical direction DR3 than the portion of the upper surface 160*a* of the molding layer 160, which is in contact with the sidewalls of the second semiconductor chip 120. An uppermost surface of the molding layer 160 (e.g., the portion of the upper surface 160*a* of the molding layer 160 which covers or surrounds the wire 140) may be coplanar with the upper surface 120*a* of the second semiconductor chip 120.

For example, a heat transfer layer 480 may be disposed on the upper surface 160*a* of the molding layer 160 and the sidewalls and the upper surface 120*a* of the protruded second semiconductor chip 120. For example, the heat transfer layer 480 may include a first portion that is above or overlaps the wire 140 in the vertical direction DR3, and a second portion surrounding the sidewalls of the protruded second semiconductor chip 120. The heat transfer layer 480 may include a first lower surface 480*b*1 and a second lower surface 480*b*2, which have a step difference. The first lower surface 480*b*1 of the heat transfer layer 480 may be defined as a lower surface of the first portion of the heat transfer layer 480. The second lower surface 480*b*2 of the heat transfer layer 480 may be defined as the lower surface of a second portion of the heat transfer layer 480. The first lower surface 480*b*1 of the heat transfer layer 480 may be formed to be at a higher vertical level than the second lower surface 480*b*2 of the heat transfer layer 480.

Each of the first and second lower surfaces 480*b*1 and 480*b*2 of the heat transfer layer 480 may be in contact with the upper surface 160*a* of the molding layer 160. The heat transfer layer 480 may be in contact with the upper surface 120*a* of the second semiconductor chip 120. For example, the second lower surface 480*b*2 of the heat transfer layer 480 may be formed on both sidewalls of the second semiconductor chip 120. That is, the second lower surface 480*b*2 of the heat transfer layer 480 may be formed to be at a lower vertical level than the upper surface 120*a* of the second semiconductor chip 120 on both sidewalls of the second semiconductor chip 120. For example, at least a portion of the second lower surface 480*b*2 of the heat transfer layer 480 may be above or overlap the first semiconductor chip 110 in the vertical direction DR3, but the present disclosure is not limited thereto. A heat sink 470 may be disposed on an upper surface of the heat transfer layer 480. The heat sink 470 may be in contact with the upper surface of the heat transfer layer 480.

Hereinafter, a semiconductor package according to some other embodiments of the present disclosure will be described with reference to FIG. 12. The following description will be based on differences from the semiconductor package shown in FIG. 9.

Figure 12:
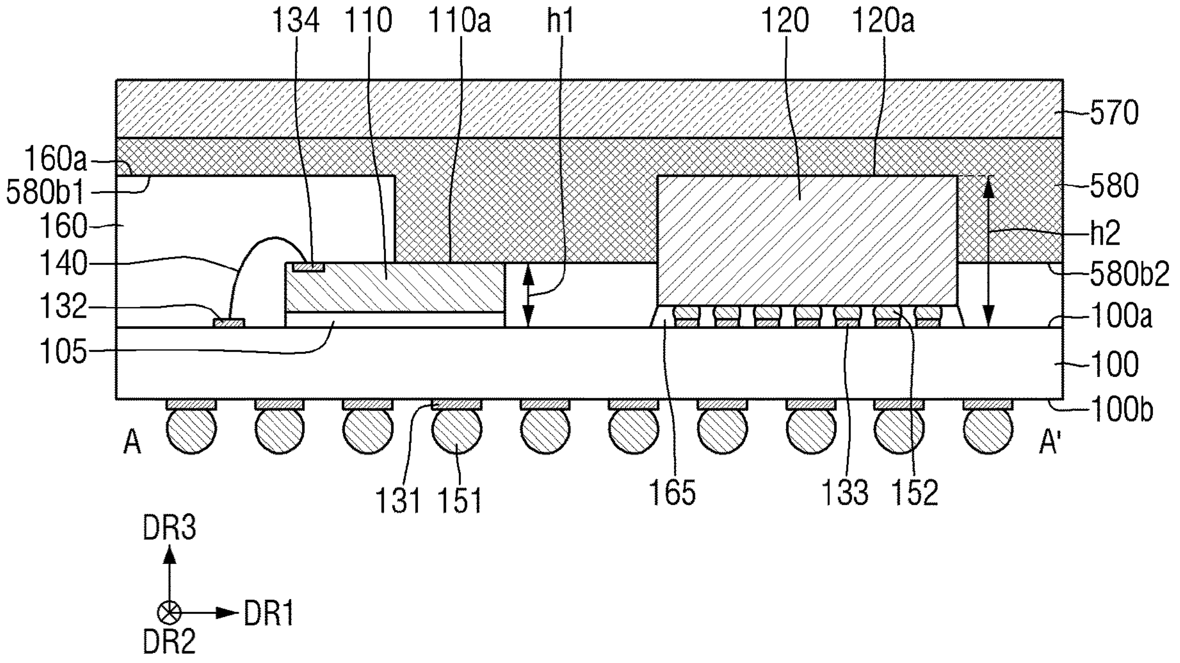
FIG. 12 is a cross-sectional view illustrating a semiconductor package according to some other embodiments of the present disclosure.

FIG. 12 is a cross-sectional view illustrating a semiconductor package according to some other embodiments of the present disclosure.

Referring to FIG. 12, in the semiconductor package according to some other embodiments of the present disclosure, at least a portion of the upper surface 160*a* of the molding layer 160 may be formed to be at a lower vertical level than the upper surface 120*a* of the second semiconductor chip 120.

For example, the upper surface 160*a* of the molding layer 160 may have a step difference or be stepped. A portion of the upper surface 160*a* of the molding layer 160, which covers or surrounds the wire 140, may be formed to be at a higher vertical level than a portion of the upper surface 160*a* of the molding layer 160, which is in contact with the sidewalls of the second semiconductor chip 120. At least a portion of the second semiconductor chip 120 may be more protruded or at a higher level in the vertical direction DR3 than the portion of the upper surface 160*a* of the molding layer 160, which is in contact with the sidewalls of the second semiconductor chip 120. An uppermost surface of the molding layer 160 (e.g., the portion of the upper surface 160*a* of the molding layer 160 which covers or surrounds the wire 140) may be coplanar with the upper surface 120*a* of the second semiconductor chip 120.

For example, a heat transfer layer 580 may be disposed on the upper surface 160*a* of the molding layer 160 and the sidewalls and the upper surface 120*a* of the protruded second semiconductor chip 120. For example, the heat transfer layer 580 may include a first portion that is above or overlaps the wire 140 in the vertical direction DR3, and a second portion surrounding the sidewalls of the protruded second semiconductor chip 120. The heat transfer layer 580 may include a first lower surface 580*b*1 and a second lower surface 580*b*2, which have a step difference. The first lower surface 580*b*1 of the heat transfer layer 580 may be defined as a lower surface of the first portion of the heat transfer layer 580. The second lower surface 580*b*2 of the heat transfer layer 580 may be defined as the lower surface of the second portion of the heat transfer layer 580. The first lower surface 580*b*1 of the heat transfer layer 580 may be formed to be at a higher vertical level than the second lower surface 580*b*2 of the heat transfer layer 580.

Each of the first and second lower surfaces 580*b*1 and 580*b*2 of the heat transfer layer 580 may be in contact with the upper surface 160*a* of the molding layer 160. The heat transfer layer 580 may be in contact with the upper surface 120*a* of the second semiconductor chip 120. For example, the second lower surface 580*b*2 of the heat transfer layer 580 may be formed on both sidewalls of the second semiconductor chip 120. That is, the second lower surface 580*b*2 of the heat transfer layer 580 may be formed to be at a lower vertical level than the upper surface 120*a* of the second semiconductor chip 120 on both sidewalls of the second semiconductor chip 120. For example, at least a portion of the second lower surface 580*b*2 of the heat transfer layer 580 may be in contact with the upper surface 110*a* of the first semiconductor chip 110. A heat sink 570 may be disposed on an upper surface of the heat transfer layer 580. The heat sink 570 may be in contact with the upper surface of the heat transfer layer 580.

Hereinafter, a semiconductor package according to some other embodiments of the present disclosure will be described with reference to FIG. 13. The following description will be based on differences from the semiconductor package shown in FIGS. 1 and 2.

Figure 13:
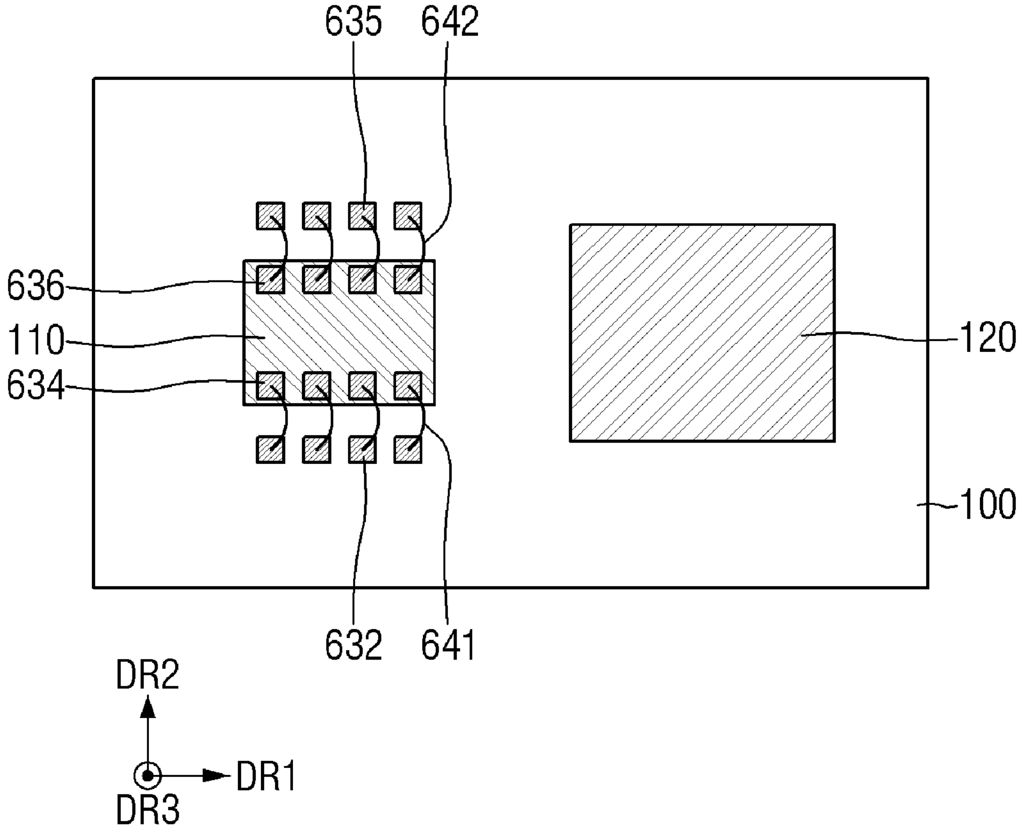
FIG. 13 is a plan view illustrating a semiconductor package according to some other embodiments of the present disclosure.

FIG. 13 is a plan view illustrating a semiconductor package according to some other embodiments of the present disclosure.

Referring to FIG. 13, in the semiconductor package according to some other embodiments of the present disclosure, a second conductive pad 632 and a fifth conductive pad 635 may be disposed on or adjacent both sidewalls of the first semiconductor chip 110 in the second horizontal direction DR2.

For example, the second conductive pad 632 may be disposed on or adjacent a first sidewall of the first semiconductor chip 110, and the fifth conductive pad 635 may be disposed on or adjacent a second sidewall of the first semiconductor chip 110, which is opposed to the first sidewall of the first semiconductor chip 110 in the second horizontal direction DR2. A first wire 641 may connect the second conductive pad 632 with a fourth conductive pad 634 disposed on the upper surface of the first semiconductor chip

110. In addition, the second wire 642 may connect the fifth conductive pad 635 with a sixth conductive pad 636 disposed on the upper surface of the first semiconductor chip 110.

Hereinafter, a semiconductor package according to some other embodiments of the present disclosure will be described with reference to FIGS. 14 and 15. The following description will be based on differences from the semiconductor package shown in FIGS. 1 and 2.

Figure 14:
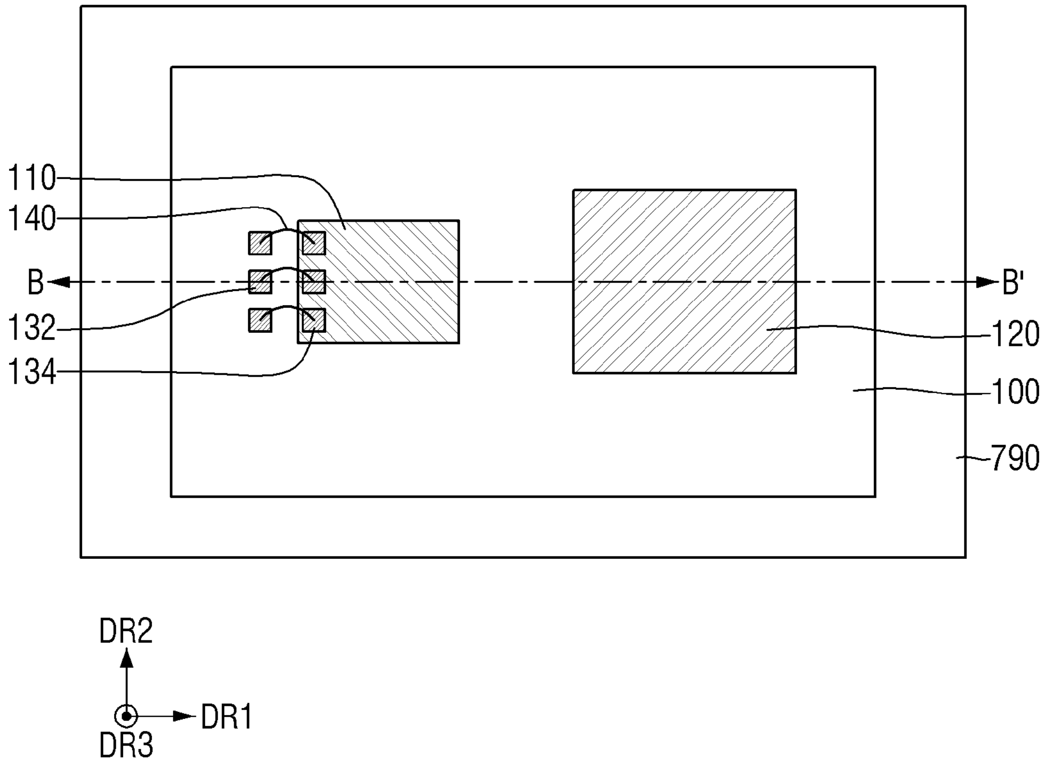
FIG. 14 is a plan view illustrating a semiconductor package according to some other embodiments of the present disclosure.

FIG. 14 is a plan view illustrating a semiconductor package according to some other embodiments of the present disclosure. FIG. 15 is a cross-sectional view taken along line B-B' of FIG. 14.

Figure 15:
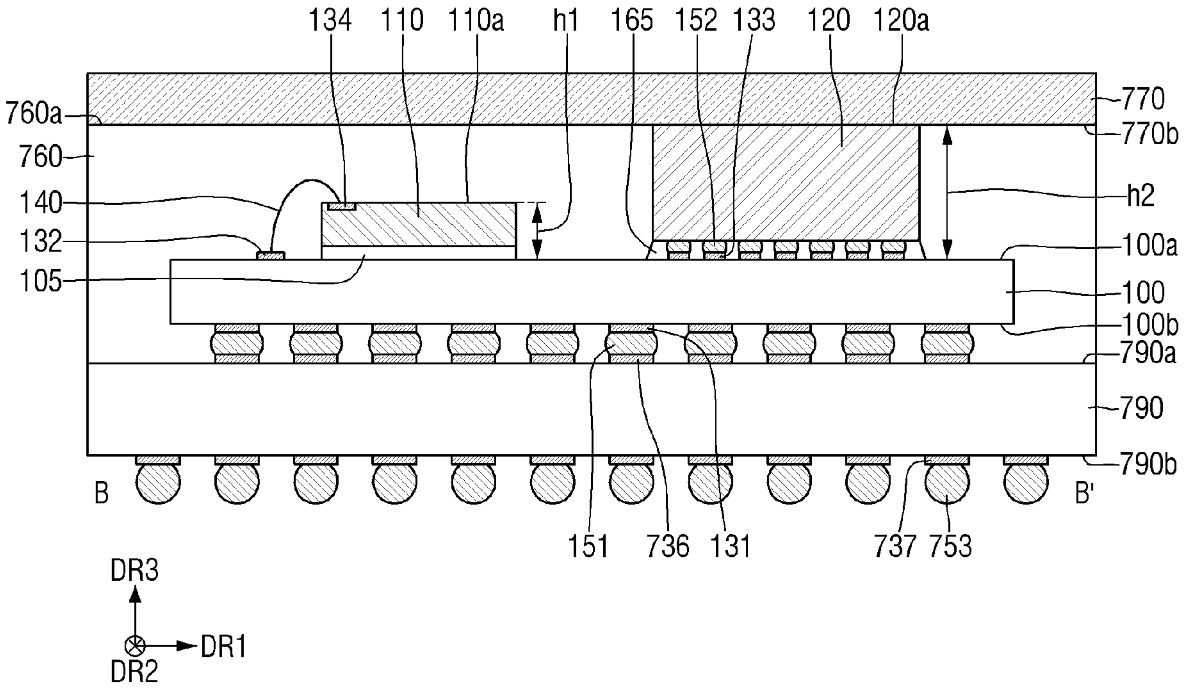
FIG. 15 is a cross-sectional view taken along line B-B' of FIG. 14.

Referring to FIGS. 14 and 15, in the semiconductor package according to some other embodiments of the present disclosure, a second substrate 790 may be disposed on the second surface 100*b* of the first substrate 100.

For example, the second substrate 790 may be a printed circuit board (PCB) or a ceramic substrate. The second substrate 790 may include a first surface 790*a* facing the second surface 100*b* of the first substrate 100, and a second surface 790*b* opposed to the first surface 790*a*. A sixth conductive pad 736 may be disposed on the first surface 790*a* of the second substrate 790. The sixth conductive pad 736 may be disposed to face the first conductive pad 131. The sixth conductive pad 736 may be connected to the first conductive pad 131 through the first connection terminal 151. That is, the second substrate 790 may be electrically connected to the first substrate 100 through the sixth conductive pad 736, the first connection terminal 151 and the first conductive pad 131. In this case, the first substrate 100 may perform an interposer function. The sixth conductive pad 736 may include a conductive material.

A seventh conductive pad 737 may be disposed on the second surface 790*b* of the second substrate 790. The seventh conductive pad 737 may include a conductive material. A third connection terminal 753 may be disposed on the second surface 790*b* of the second substrate 790. The third connection terminal 753 may be connected to the seventh conductive pad 737. The third connection terminal 753 may protrude to be convex from the second surface 790*b* of the second substrate 790. The third connection terminal 753 may be a portion in which the second substrate 790 is electrically connected to another external device.

The third connection terminal 753 may include at least one of, for example, tin (Sn), indium (In), lead (Pb), zinc (Zn), nickel (Ni), gold (Au), silver (Ag), copper (Cu), antimony (Sb), bismuth (Bi) or combinations thereof, but the present disclosure is not limited thereto.

A molding layer 760 may be disposed on the first surface 790*a* of the second substrate 790. The molding layer 760 may cover the wire 140, sidewalls of the adhesive layer 105, sidewalls and an upper surface 110*a* of the first semiconductor chip 110, sidewalls of the underfill material 165 and sidewalls of the second semiconductor chip 120. Also, the molding layer 760 may cover sidewalls of the sixth conductive pad 736, sidewalls of the first connection terminal 151, sidewalls of the first conductive pad 131 and sidewalls and at least a portion of the lower surface 100*b* of the first substrate 100, but the present disclosure is not limited thereto. In some other embodiments, the molding layer 760 may be provided with an underfill material disposed between the first surface 790*a* of the second substrate 790 and the second surface 100*b* of the first substrate 100 to surround each of the sidewalls of the sixth conductive pad 736, the sidewalls of the first connection terminal 151 and the sidewalls of the first conductive pad 131. For example, the sidewalls of the molding layer 760 may be aligned in the vertical direction DR3 with the sidewalls of the second substrate 790 (e.g., the sidewalls of the molding layer 760 and the sidewalls of the second substrate 790 may be coplanar), but the present disclosure is not limited thereto.

A heat sink 770 may be disposed on the upper surface 760*a* of the molding layer 760 and the upper surface 120*a* of the second semiconductor chip 120. A lower surface 770*b* of the heat sink 770 may be in contact with each of the upper surface 760*a* of the molding layer 760 and the upper surface 120*a* of the second semiconductor chip 120. Although FIG. 15 shows that the heat sink 770 is disposed only on the upper surface 760*a* of the molding layer 760 and the upper surface 120*a* of the second semiconductor chip 120, the present disclosure is not limited thereto. In some other embodiments, the heat sink 770 may cover the sidewalls of the molding layer 760.

Hereinafter, a semiconductor package according to some other embodiments will be described with reference to FIG. 16. The following description will be based on differences from the semiconductor package shown in FIGS. 14 and 15.

Figure 16:
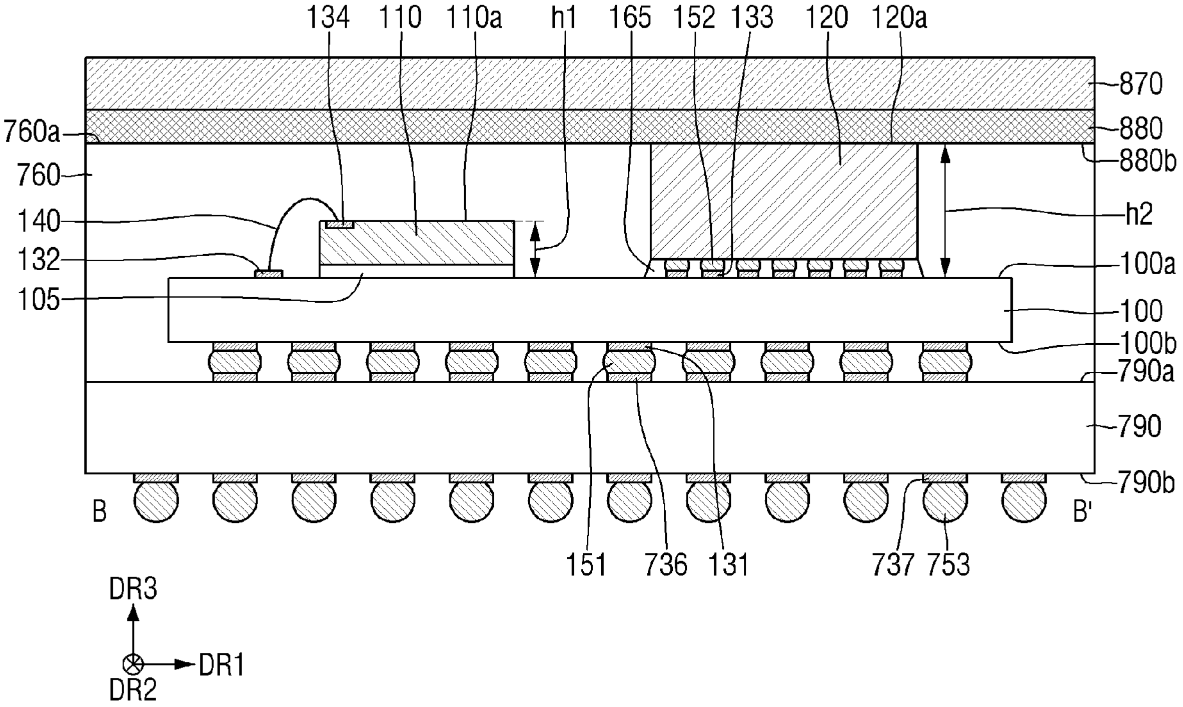
FIG. 16 is a cross-sectional view illustrating a semiconductor package according to some other embodiments of the present disclosure.

FIG. 16 is a cross-sectional view illustrating a semiconductor package according to some other embodiments of the present disclosure.

Referring to FIG. 16, in the semiconductor package according to some other embodiments of the present disclosure, a heat transfer layer 880 may be disposed between the molding layer 760 and the second semiconductor chip 120 and the heat sink 870.

For example, the heat transfer layer 880 may be disposed on the upper surface 760*a* of the molding layer 760 and the upper surface 120*a* of the second semiconductor chip 120. A lower surface 880*b* of the heat transfer layer 880 may be in contact with the upper surface 760*a* of the molding layer 760 and the upper surface 120*a* of the second semiconductor chip 120. The heat transfer layer 880 may include a material having high heat transfer performance. For example, the heat transfer layer 880 may include a conductive material such as metal. In some other embodiments, the heat transfer layer 880 may include a non-conductive material having high heat transfer performance.

The heat sink 870 may be disposed on an upper surface of the heat transfer layer 880. The heat sink 870 may be in contact with the upper surface of the heat transfer layer 880. Although FIG. 16 shows that the heat sink 870 is disposed only on the upper surface of the heat transfer layer 880, the present disclosure is not limited thereto. In some other embodiments, the heat sink 870 may be also disposed on the sidewalls of the molding layer 760.

Although embodiments of the present disclosure have been described with reference to the accompanying drawings, it will be apparent to those skilled in the art that the present disclosure can be manufactured in various forms without being limited to the above-described embodiments and can be embodied in other specific forms without departing from the scope of the present disclosure. Thus, the above embodiments are to be considered in all respects as illustrative and not restrictive.

What is claimed is:

1. A semiconductor package comprising:

a first substrate including a first surface and a second surface opposite the first surface;

a memory semiconductor package on the first surface of the first substrate, the memory semiconductor package including a plurality of memory semiconductor chips;

an adhesive layer between the first surface of the first substrate and the memory semiconductor package, the adhesive layer attaching the memory semiconductor package to the first surface of the first substrate;

a wire extending from an upper surface of the memory semiconductor package to the first substrate, the wire electrically connecting the first substrate and the memory semiconductor package;

a logic semiconductor chip spaced apart from the memory semiconductor package in a first horizontal direction on the first surface of the first substrate;

a first connection terminal between the first surface of the first substrate and the logic semiconductor chip, the first connection terminal electrically connecting the first substrate and the logic semiconductor chip; and a molding layer covering the wire, sidewalls and at least a portion of the upper surface of the memory semiconductor package and at least a portion of sidewalls of the logic semiconductor chip on the first surface of the first substrate, wherein a first height from the first surface of the first substrate to the upper surface of the memory semiconductor package in a vertical direction is smaller than a second height from the first surface of the first substrate to an upper surface of the logic semiconductor chip in the vertical direction, and wherein an uppermost surface of the molding layer and the upper surface of the logic semiconductor chip are coplanar.

2. The semiconductor package of claim 1, wherein an upper surface of the molding layer is entirely coplanar with the upper surface of the logic semiconductor chip.

3. The semiconductor package of claim 1, further comprising a heat sink on an upper surface of the molding layer and the upper surface of the logic semiconductor chip, the heat sink in contact with the upper surface of the logic semiconductor chip.

4. The semiconductor package of claim 1, further comprising:

a heat transfer layer on an upper surface of the molding layer and the upper surface of the logic semiconductor chip, the heat transfer layer in contact with the upper surface of the logic semiconductor chip; and a heat sink on the heat transfer layer.

5. The semiconductor package of claim 4, wherein the heat transfer layer is in contact with at least a portion of the sidewalls of the logic semiconductor chip.

6. The semiconductor package of claim 4, wherein the heat transfer layer is in contact with at least a portion of the upper surface of the memory semiconductor package.

7. The semiconductor package of claim 4, wherein the heat transfer layer includes:

a first portion above the wire; and a second portion surrounding at least a portion of the sidewalls of the logic semiconductor chip, and wherein a lower surface of the first portion of the heat transfer layer is at a higher vertical level than a lower surface of the second portion of the heat transfer layer.

8. The semiconductor package of claim 1, further comprising:

a first conductive pad on the first surface of the first substrate, the first conductive pad spaced apart from the memory semiconductor package in the first horizontal direction, the first conductive pad connected to a first end of the wire; and a second conductive pad on the upper surface of the memory semiconductor package, the second conductive pad connected to an opposite second end of the wire.

9. The semiconductor package of claim 1, further comprising:

a first conductive pad on the first surface of the first substrate, the first conductive pad spaced apart from the memory semiconductor package in a second horizontal direction perpendicular to the first horizontal direction, the first conductive pad is connected to a first end of the wire; and a second conductive pad on the upper surface of the memory semiconductor package, the second conductive pad connected to an opposite second end of the wire.

10. The semiconductor package of claim 1, further comprising:

a second substrate on the second surface of the first substrate; and a second connection terminal between the second substrate and the second surface of the first substrate, the second connection terminal electrically connecting the first substrate and the second substrate.

11. A semiconductor package comprising:

a first substrate including a first surface and an opposite second surface;

a first semiconductor chip on the first surface of the first substrate;

an adhesive layer between the first surface of the first substrate and the first semiconductor chip, the adhesive layer attaching the first semiconductor chip to the first surface of the first substrate;

a wire extending from an upper surface of the first semiconductor chip to the first substrate, the wire electrically connecting the first substrate and the first semiconductor chip;

a second semiconductor chip on the first surface of the first substrate, the second semiconductor chip spaced apart from the first semiconductor chip;

a first connection terminal between the first surface of the first substrate and the second semiconductor chip, the first connection terminal electrically connecting the first substrate and the second semiconductor chip;

a molding layer on the first surface of the first substrate, the molding layer covering the wire, sidewalls and at least a portion of the upper surface of the first semiconductor chip and at least a portion of sidewalls of the second semiconductor chip; and a heat transfer layer in contact with an uppermost surface of the molding layer and an upper surface of the second semiconductor chip, wherein a first height from the first surface of the first substrate to the upper surface of the first semiconductor chip is smaller than a second height from the first surface of the first substrate to the upper surface of the second semiconductor chip.

12. The semiconductor package of claim 11, wherein the uppermost surface of the molding layer is entirely coplanar with the upper surface of the second semiconductor chip.

13. The semiconductor package of claim 11, further comprising a heat sink on the heat transfer layer.

14. The semiconductor package of claim 11, wherein the heat transfer layer is in contact with at least a portion of the sidewalls of the second semiconductor chip.

15. The semiconductor package of claim 11, wherein an upper surface of the molding layer is at a lower vertical level than the upper surface of the second semiconductor chip.

16. The semiconductor package of claim 11, wherein the heat transfer layer includes:

a first portion above the wire; and a second portion surrounding at least a portion of the sidewalls of the second semiconductor chip, and wherein a lower surface of the first portion of the heat transfer layer is at a higher vertical level than a lower surface of the second portion of the heat transfer layer.

17. The semiconductor package of claim 11, further comprising:

a second substrate on the second surface of the first substrate; and a second connection terminal between the second substrate and the second surface of the first substrate, the second connection terminal electrically connecting the first substrate and the second substrate.

18. The semiconductor package of claim 11, wherein the first semiconductor chip is a memory semiconductor package that includes a plurality of memory semiconductor chips, and wherein the second semiconductor chip is a logic semiconductor chip.

19. A semiconductor package comprising:

a first substrate including a first surface and a second surface opposite the first surface;

a memory semiconductor package on the first surface of the first substrate;

an adhesive layer between the first surface of the first substrate and the memory semiconductor package, the adhesive layer attaching the memory semiconductor package to the first surface of the first substrate;

a wire extending between an upper surface of the memory semiconductor package and the first substrate, the wire electrically connecting the first substrate and the memory semiconductor package;

a logic semiconductor chip on the first surface of the first substrate and spaced apart from the memory semiconductor package;

a first connection terminal between the first surface of the first substrate and the logic semiconductor chip, the first connection terminal electrically connecting the first substrate with the logic semiconductor chip;

a molding layer on the first surface of the first substrate, the molding layer on the wire, sidewalls and at least a portion of the upper surface of the memory semiconductor package and at least a portion of sidewalls of the logic semiconductor chip; and a heat sink on an upper surface of the molding layer and an upper surface of the logic semiconductor chip, the heat sink in contact with the upper surface of the logic semiconductor chip, wherein a first height from the first surface of the first substrate to the upper surface of the memory semiconductor package is smaller than a second height from the first surface of the first substrate to the upper surface of the logic semiconductor chip, and wherein the upper surface of the molding layer is coplanar with the upper surface of the logic semiconductor chip.

20. The semiconductor package of claim 19, further comprising:

a second substrate on the second surface of the first substrate; and a second connection terminal between the second substrate and the second surface of the first substrate, the second connection terminal electrically connecting the first substrate and the second substrate.

* * * * *